(12) United States Patent
Nayak et al.

(10) Patent No.: US 6,372,590 B1
(45) Date of Patent: Apr. 16, 2002

(54) METHOD FOR MAKING TRANSISTOR HAVING REDUCED SERIES RESISTANCE

(75) Inventors: Deepak K. Nayak, Santa Clara; Ming-Yin Hao, Sunnyvale, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/950,717

(22) Filed: Oct. 15, 1997

(51) Int. Cl.$^7$ ............................................. H01L 21/336
(52) U.S. Cl. ........................ 438/305; 438/306; 438/307; 438/231; 438/232; 438/516
(58) Field of Search ................................. 438/199, 305, 438/306, 307, 231, 232, 516, FOR 204, FOR 216, FOR 217, FOR 218

(56) References Cited

U.S. PATENT DOCUMENTS

| | | |
|---|---|---|
| 3,877,059 A | 4/1975 | Dockendorf et al. |
| 4,635,068 A | 1/1987 | Wheeler et al. |
| 4,689,869 A | 9/1987 | Jambotkar et al. |
| 4,828,795 A | 5/1989 | Cook et al. |
| 4,885,617 A | 12/1989 | Mazure-Espejo et al. |
| 5,011,784 A | 4/1991 | Ratnakumar |
| 5,162,884 A | 11/1992 | Liou et al. |
| 5,258,095 A | 11/1993 | Nagata et al. |
| 5,338,698 A | 8/1994 | Subbanna |
| 5,389,809 A | 2/1995 | Haken et al. |
| 5,427,963 A | 6/1995 | Richart et al. |
| 5,468,657 A | 11/1995 | Hsu |
| 5,489,540 A | 2/1996 | Liu et al. |
| 5,580,804 A | 12/1996 | Joh |
| 5,597,746 A | 1/1997 | Prall |
| 5,610,088 A | 3/1997 | Chang et al. |
| 5,643,815 A | 7/1997 | Vu et al. |
| 5,650,651 A | 7/1997 | Bui |
| 5,650,753 A | 7/1997 | Ling |
| 5,652,155 A | 7/1997 | Liu et al. |
| 5,659,194 A * | 8/1997 | Iwamatsu et al. ............ 257/377 |
| 5,661,067 A * | 8/1997 | Lee et al. .................... 438/420 |
| 5,719,424 A * | 2/1998 | Ahmad et al. ............... 257/336 |
| 5,825,066 A * | 10/1998 | Buynoski ..................... 257/345 |
| 5,827,761 A * | 10/1998 | Fulford, Jr. et al. ......... 438/199 |
| 5,851,893 A * | 12/1998 | Garder et al. ................ 438/305 |
| 5,861,335 A * | 1/1999 | Hause et al. ................. 438/308 |
| 5,910,672 A * | 6/1999 | Iwamatsu et al. ............ 257/347 |
| 5,936,287 A * | 8/1999 | Gardner et al. ............. 257/369 |

OTHER PUBLICATIONS

Shimizu, S., et al., "Impact of surface proximity . . . micron CMOS LDD FETs", Electron Devices Meeting, pp. 859–862, Dec. 1995.*

Yamaguchi, Y., et al., "Improvement of leakage–current–related yield of SOI MOSFETs . . . the source and drain regions", SOI Conference, pp. 168–169, Oct. 1996.*

Kuroi, T., "Novel NICE . . . dual gate CMOS", Electron Devices Meeting, pp. 325–328, Dec. 1993.*

* cited by examiner

Primary Examiner—Long Pham
(74) Attorney, Agent, or Firm—Amin & Turocy, LLP

(57) ABSTRACT

A transistor having reduced series resistance and method for producing the same. The method reduces transistor series resistance by implanting nitrogen into an nLDD/Source/Drain extension region of the transistor. The nitrogen implantation in connection with the implantation of a conventional n-type dopant (e.g. arsenic or phosphorus), results in a transistor having low series resistance, reduced hot carrier effects and no significant increase in source/drain extension overlap.

19 Claims, 7 Drawing Sheets

METHOD FOR MAKING TRANSISTOR HAVING REDUCED SERIES RESISTANCE

TECHNICAL FIELD

The present invention generally relates to a method for reducing transistor series resistance. In particular, the present invention relates to a method for reducing transistor series resistance by nitrogen implantation into an nLDD/Source/Drain extension region of the transistor.

BACKGROUND OF THE INVENTION

Complimentary metal-oxide semiconductor (CMOS) designs have become popular in logic circuit designs for numerous reasons including their noise immunity, operability over wide voltage ranges and other properties. Such advantages outweigh the fact that oftentimes a greater number of transistors is necessary on a chip for equivalent logic functions as compared to other field effect transistor FET technologies.

Two types of transistors formed in a complimentary metal-oxide semiconductor (CMOS) fabrication process are NMOS and PMOS. PMOS transistors and NMOS transistors each have four terminals (or connection points): a gate terminal, a source terminal, a drain terminal, and a bulk terminal. Electric current flows from the source terminal to the drain terminal of a transistor when a voltage applied to the gate terminal has either a higher or lower value than the voltage applied to the source terminal, depending on the transistor type. A PMOS transistor is a transistor in which current flows if the voltage applied to the gate terminal is lower than the voltage applied to the source terminal. An NMOS transistor is a transistor in which current flows if the voltage applied to the gate terminal is higher than the voltage applied to the source terminal. The bulk terminal is connected either to the source terminal of the transistor or to an appropriate bias voltage.

In both the PMOS transistor and NMOS transistor, the difference in voltage between the gate terminal and the source terminal must be larger in absolute value than a certain voltage before current will flow between the source and drain terminals. This particular voltage is commonly referred to as a "threshold" voltage and is the voltage required to form a channel between source and drain diffusion regions in the PMOS transistor or the NMOS transistor. As is known, the respective transistors are formed on a substrate by diffusing impurities into two regions (a drain diffusion region and a source diffusion region). The two regions are separated by a distance of undiffused substrate material called a channel, over which the gate terminal is constructed. By applying a voltage to the gate terminal of the transistor, the channel is energized such that current may flow between the source diffusion region and the drain diffusion region.

An impurity well of opposite conductivity type is required for one of the transistors of each complementary circuit. These additional structures occupy space on the chip and thus contribute to the incentive for miniaturization of the transistors formed thereon.

Several limitations on miniaturization of field-effect transistors have been encountered. As a conduction channel is made small, several adverse effects on transistor performance occur such as series resistance and/or hot electron carrier effects.

The series resistance of an FET is a function of both the cross-sectional area and length of the conduction channel. It is desirable to limit the depth which the conduction channel extends into the substrate in order to limit the voltage which is needed to control the FET as well as to limit leakage and punch-through effects. However, the use of such shallow junctions causes the series resistance to increase. Series resistance must be maintained at a low value in order not to degrade the extrinsic transconductance of the FET.

In general, the greater the extrinsic transconductance of the FET, the faster the circuit performance obtained. Low series resistance is often achieved by siliciding (i.e., forming a metal silicide at a metal-silicon interface) the source and drain or selectively depositing metal such as tungsten on the source and drain areas. However, this is difficult to achieve consistently for shallow junctions. The silicidation consumes surface silicon and can give rise to increased leakage current. Self-aligned silicides such as titanium disilicide are frequently formed on source/drains to lower sheet resistivity. However, a heavily phosphorus-doped n-type source/drain (to minimize the silicon/silicide contact resistance) leads to a deep source/drain region. Contrarily, an arsenic doped source/drain region will not be deep enough to avoid consumption of the shallow arsenic-doped silicon during silicidation leading to high junction leakage or spiking by the silicide through to the substrate if (as in CMOS structures) only low drive-in temperature can be used because of high diffusivity of boron implants in other parts of the integrated circuit.

Increases in series resistance cannot be fully compensated by decreasing the length of the conduction channel. While a short conduction channel is desirable both for miniaturization as well as low series resistance, when the conduction channel is reduced below 1 $\mu$m, the threshold voltage is reduced due to charge sharing with the drain junction. Similarly, leakage and punch through effects are increased. The leakage or "off" state current is increased due to the reduced threshold voltage, resulting in increased standby current for the chip. When the threshold voltage is lowered by a large amount, the device is said to be punched through. While the threshold reduction can be limited by reducing the depth of the conduction channel, reduction of depth of the channel degrades series resistance, as discussed above.

Thus a difficulty in the fabrication of small-geometry metal-oxide-silicon transistors is that if the source/drains are doped to a level high enough to give a reasonable low series resistance, the magnitude of the electric field in the channel adjacent the drain during the on-state will be so high that hot carriers and impact ionization effects become a nuisance.

Consequently, there is a need in the art for a method for fabricating CMOS devices and the like which reduces series resistance without increasing leakage and punch through effects.

SUMMARY OF THE INVENTION

By introducing a nitrogen implanting step in connection with a conventional n-type dopant implanting step (e.g., arsenic implanting step), a CMOS device results having low series resistance, reduced hot carrier effects and avoids a significant increase in source/drain (S/D) extension overlap (i.e., horizontal spreading of the implant). Contrary to conventional CMOS fabrication techniques where increasing dopant concentration results in lower sheet resistance, the nitrogen implantation of the present invention does not result in a deeper junction as a result of the increase in dopant. If a conventional dopant (e.g., arsenic or phosphorus) concentration is increased to lower sheet resistance, a deeper junction results. Deeper junctions result in bad roll-off, makes the device more difficult to control, and may result in punch through effects which are undesirable. The present invention avoids these negative effects because the addition of the nitrogen dopant does not increase the depth of the junction which is typically the case with conventional n-type dopants such as arsenic. The nitrogen implantation provides for reduced series resistance without increasing junction depth and reduced hot carrier effects as compared to using a conventional n-type dopant.

In accordance with one specific aspect of the present invention, a method of fabricating a complimentary MOS transistor having a source/drain extension region is provided, including the step of: implanting nitrogen into the source/drain extension region.

According to another aspect of the present invention, a method of fabricating a complimentary MOS transistor is provided including the steps of: providing a substrate having field oxide regions thereon; providing an p-well region by masking a portion of the substrate with a first photoresist layer and implanting p-well dopants; providing an n-well region by masking the portion of the substrate designated for the p-well region with a second photoresist layer and implanting n-well dopants; forming a polygate structure on the n-well and p-well regions; masking the n-well with an n-channel LDD mask; implanting an n-implant into the p-well region; and implanting nitrogen into the p-well region.

Another aspect of the present invention provides for a complimentary MOS transistor including a lightly doped region which was implanted with nitrogen.

In accordance with another aspect of the present invention, a method of fabricating a field effect transistor having a source/drain extension region is provided, including the step of: implanting nitrogen into the source/drain extension region.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
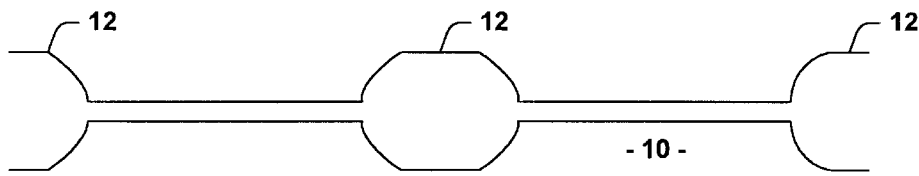
FIG. 1a is a schematic cross-sectional illustration of a P substrate with screen oxide regions in accordance with the present invention.

The present invention will now be described with reference to the drawings, wherein like reference numerals are used to refer to like elements throughout. The method of the present invention will be described with reference to the formation of a CMOS transistor having source/drain (S/D) extension regions (i.e., lightly doped drain (LDD) regions). However, the method is applicable to other processes, for example, a process for forming n-channel MOS transistors, or Bipolar-CMOS transistors (commonly known as BiCMOS transistors). Furthermore, the following detailed description is of the best modes presently contemplated by the inventors for practicing the invention. It should be understood that the description of these preferred embodiments are merely illustrative and that they should not be taken in a limiting sense.

The present invention generally relates to a method for reducing transistor series resistance. In particular, the present invention relates to a method for reducing transistor series resistance by nitrogen implantation into an nLDD/Source/Drain extension region of the transistor. By employing in a CMOS fabrication process a nitrogen implanting step in connection with a conventional n-type dopant implanting step (e.g., arsenic implanting step), a CMOS device results having low series resistance, reduced hot carrier effects and no significant increase in S/D extension overlap.

Figure 1B:
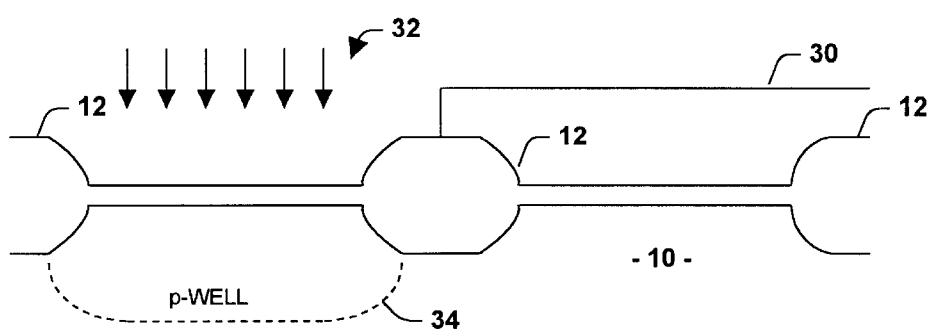
FIG. 1b is a schematic cross-sectional illustration of the formation of an p-well region in accordance with the present invention.
Figure 1C:
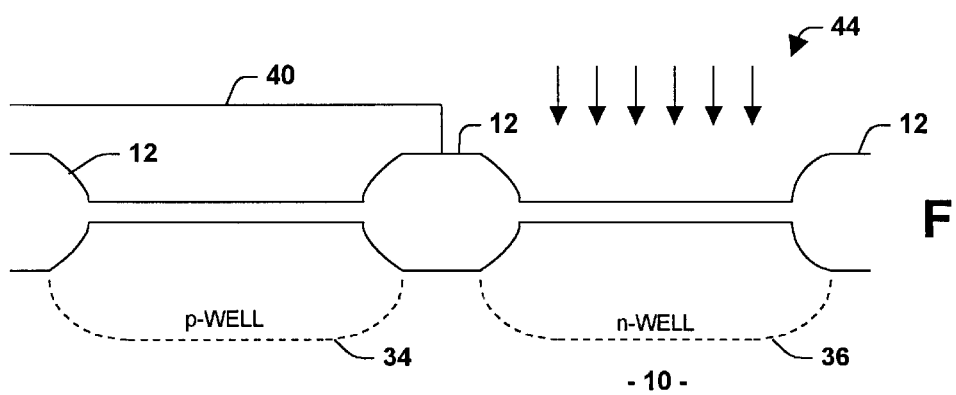
FIG. 1c is a schematic cross-sectional illustration of the formation of an n-well region in accordance with the present invention.
Figure 1D:
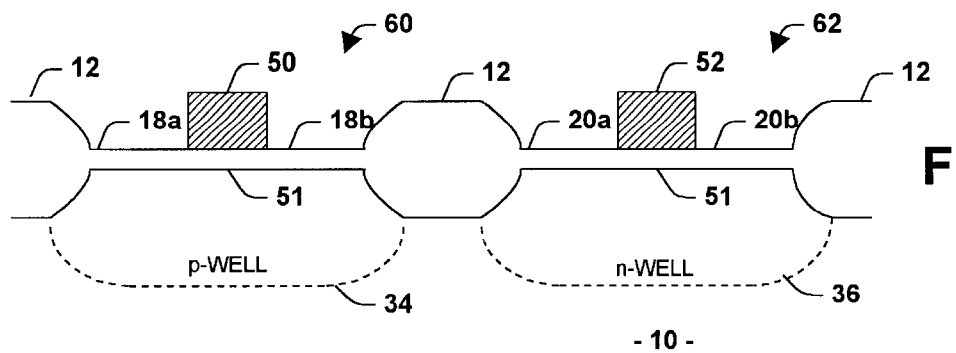
FIG. 1d is a schematic cross-sectional illustration of the formation of a polygate structure in accordance with the present invention.

Referring initially to FIGS. 1a–1k, one specific aspect of the present invention is shown with respect to a S/D extension process in connection with fabricating CMOS transistors. FIG. 1a shows a p-substrate (e.g., a silicon wafer) 10 having field oxide regions 12 formed thereon which serve as isolation barriers to define active regions 18a, 18b, 20a and 20b (FIG. 1d). The field oxide regions 12 may be formed using any suitable fabrication technique. FIG. 1b shows the formation of a p-well region by masking a portion of the substrate 10 with a photoresist layer 30 and implanting p-well dopants 32 to provide an p-well 34. Similarly, in FIG. 1c an n-well region 36 is formed by masking the portion of the substrate designated for the p-well with a photoresist layer 40 and implanting n-well dopants 44 to provide an n-well 36.

Thereafter as shown in FIG. 1d gate oxide 51 and polygate structures 50, 52 are formed between the field oxide regions 12 to define the active regions 18a, 18b, 20a and 20b. Active regions 18a, 18b and gate 50 will respectively form the drain, source and gate regions of the n-channel transistor 60. Likewise, active regions 20a, 20b and gate 52 will respectively form the source, drain and gate regions of the p-channel transistor 62.

Figure 1E:
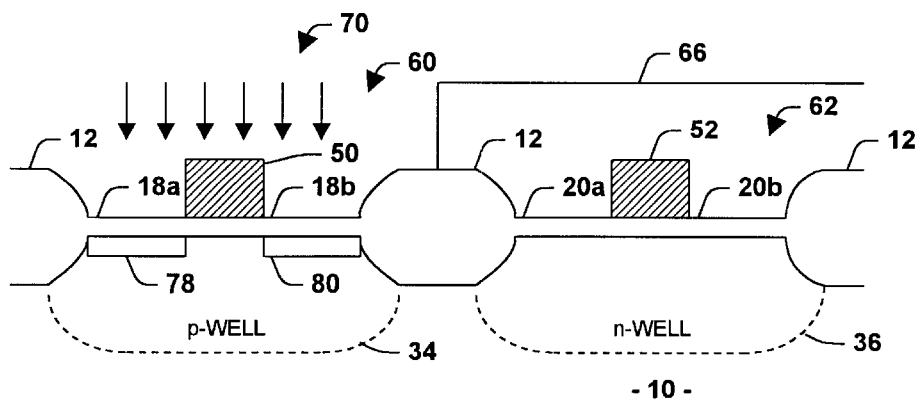
FIG. 1e is a schematic cross-sectional illustration of an n-channel LDD mask application and a first ion implant step in accordance with the present invention.

FIG. 1e illustrates an n-well mask application and a first ion implant step. This n-channel LDD mask application step uses an n-channel LDD mask 66 over the substrate 10 to cover p-channel transistor 62, and to expose n-channel transistor 60. The mask 66 effectively masks off gate structure 52 and active regions 20a and 20b. Then, an n-implant 70 is used to form n-channel transistor lightly doped regions 78 and 80 which are self-aligned with the gate 50. In the preferred embodiment, this S/D implant step is an arsenic implant having a dose in the range of $1 \times 10^{14}$ to $1 \times 10^{16}$ atoms/cm$^2$ and an energy range of about 1 KeV to about 100 KeV. Arsenic is employed to make a substantially shallow junction because of its heavy nature and less tendency to move. Of course it will be appreciated that any suitable dose and energy range and implant may be employed to carry out the present invention.

Figure 1F:
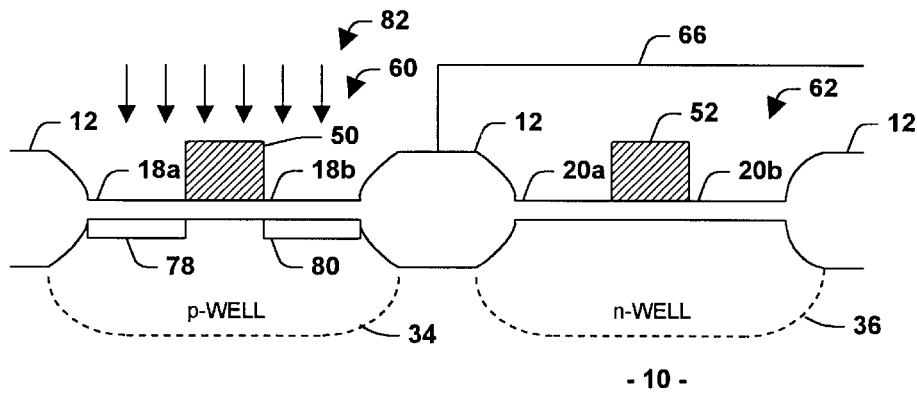
FIG. 1f is a schematic cross-sectional illustration of a nitrogen implant step in accordance with the present invention.
Figure 1G:
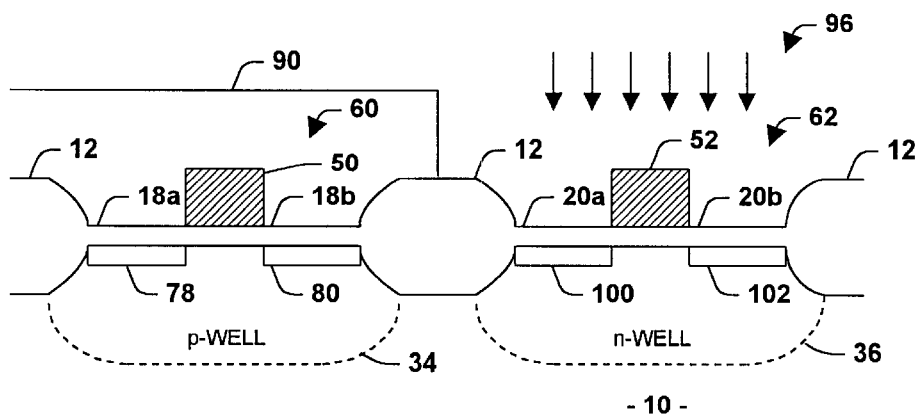
FIG. 1g is a schematic cross-sectional illustration of an p-channel masking step in accordance with the present invention.
Figure 1H:
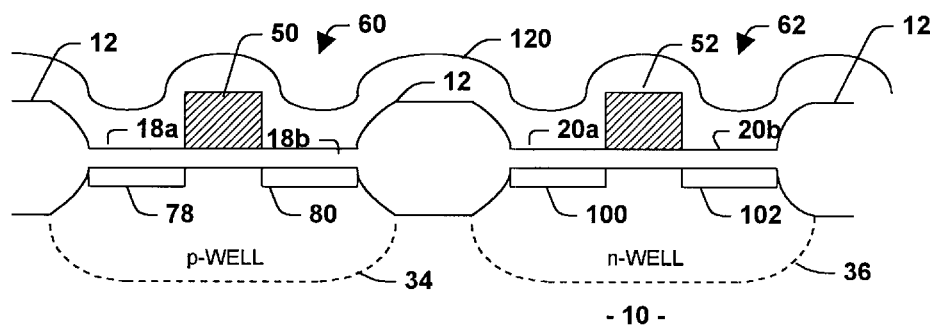
FIG. 1h is a schematic cross-sectional illustration of a spacer formation step in accordance with the present invention.

Next, after the step of implanting arsenic, nitrogen 82 is added via implantation in the lightly doped regions 78 and 80 as shown in FIG. 1f. The nitrogen implant 82 is applied at a dose of $1 \times 10^{14}$ to $5 \times 10^{15}$ atoms/cm$^2$ with an energy range of about 1 KeV to 100 KeV. It will be appreciated that although in the preferred embodiment the nitrogen implant step is performed after the arsenic implantation 70 (FIG. 1e), the nitrogen implantation 82 may be performed prior to the arsenic implantation 70. The same mask may be utilized in each step. The formation of the transistors is then completed as described more fully below.

The implantation of the nitrogen as represented in FIG. 1f results in reduced series resistance and hot carrier effects without significantly increasing S/D extension overlap. As mentioned above, contrary to conventional CMOS fabrication techniques where increasing dopant concentration results in lower sheet resistance, the nitrogen implantation 82 does not result in a deeper junction as a result of the increase in dopant. On the other hand, if the arsenic dopant dose is increased in order to lower sheet resistance, a deeper junction would result. The deeper junction would result in bad roll-off, make the CMOS device more difficult to control, and possibly result in punch through effects. The implanation of nitrogen avoids these negative effects because the nitrogen does not increase the depth of the junction which is typically the case with conventional n-type dopants such as arsenic. However, unlike conventional techniques, the nitrogen implantation results in reduced series resistance. Thus, the present invention provides for reducing series resistance without the negative consequences (e.g., hot electron carrier and punch through effects) associated with conventional techniques.

Furthermore, the nitrogen implantation does not result in any significant increase in the amount of diffusion of the S/D extension into the gate. As mentioned above, when an implant is provided in the S/D extension region the implant not only spreads vertically there is also horizontal spreading of the implant which is known as S/D extension overlap into the gate. The present invention does not result in any significant increase in S/D extension overlap as compared to conventional dopants.

Figure 2A:
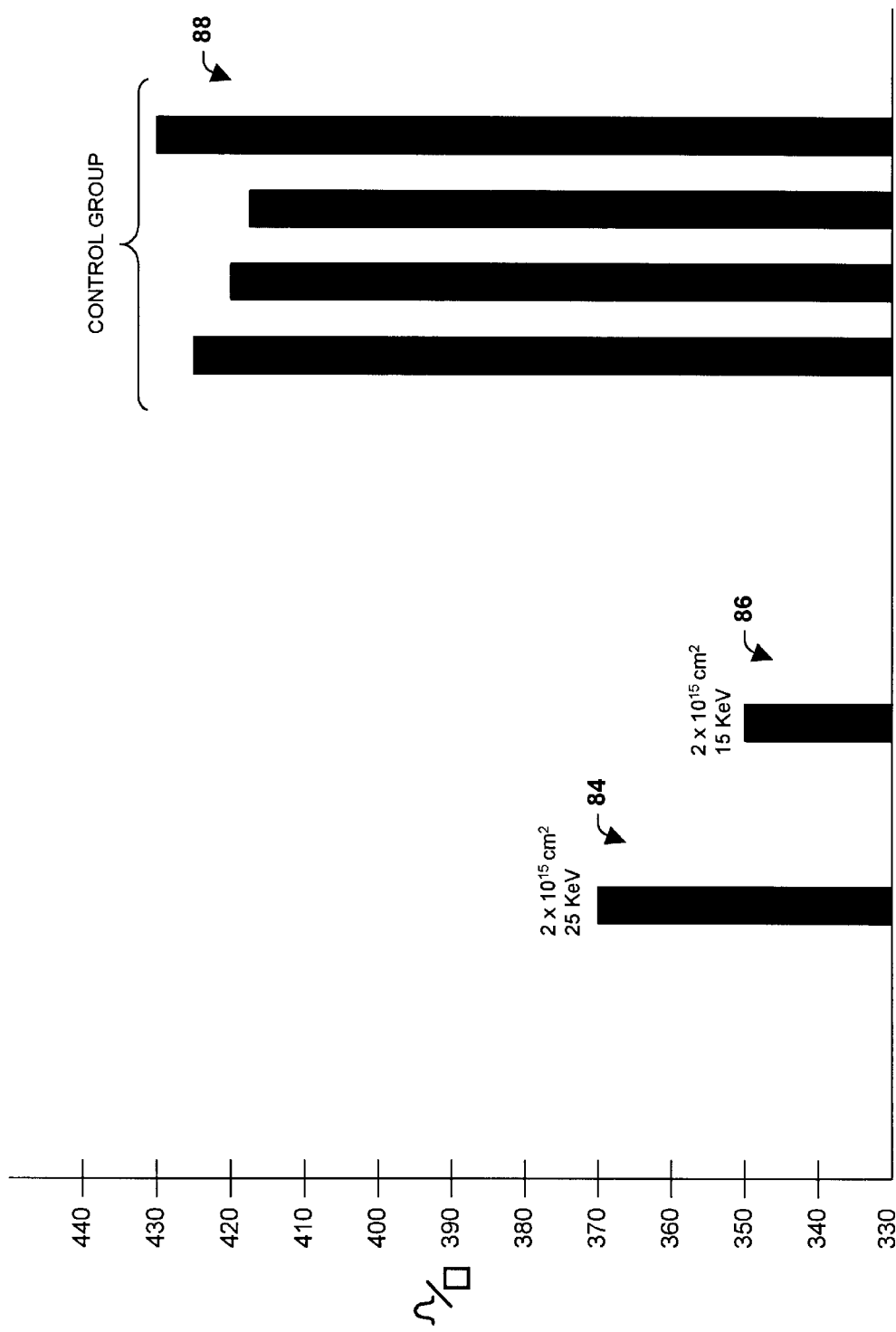
FIG. 2a is a bar chart illustrating sheet resistance of source/drain extension regions of CMOS devices in accordance with the present invention and sheet resistance of source/drain extension regions of CMOS control devices.
Figure 2B:
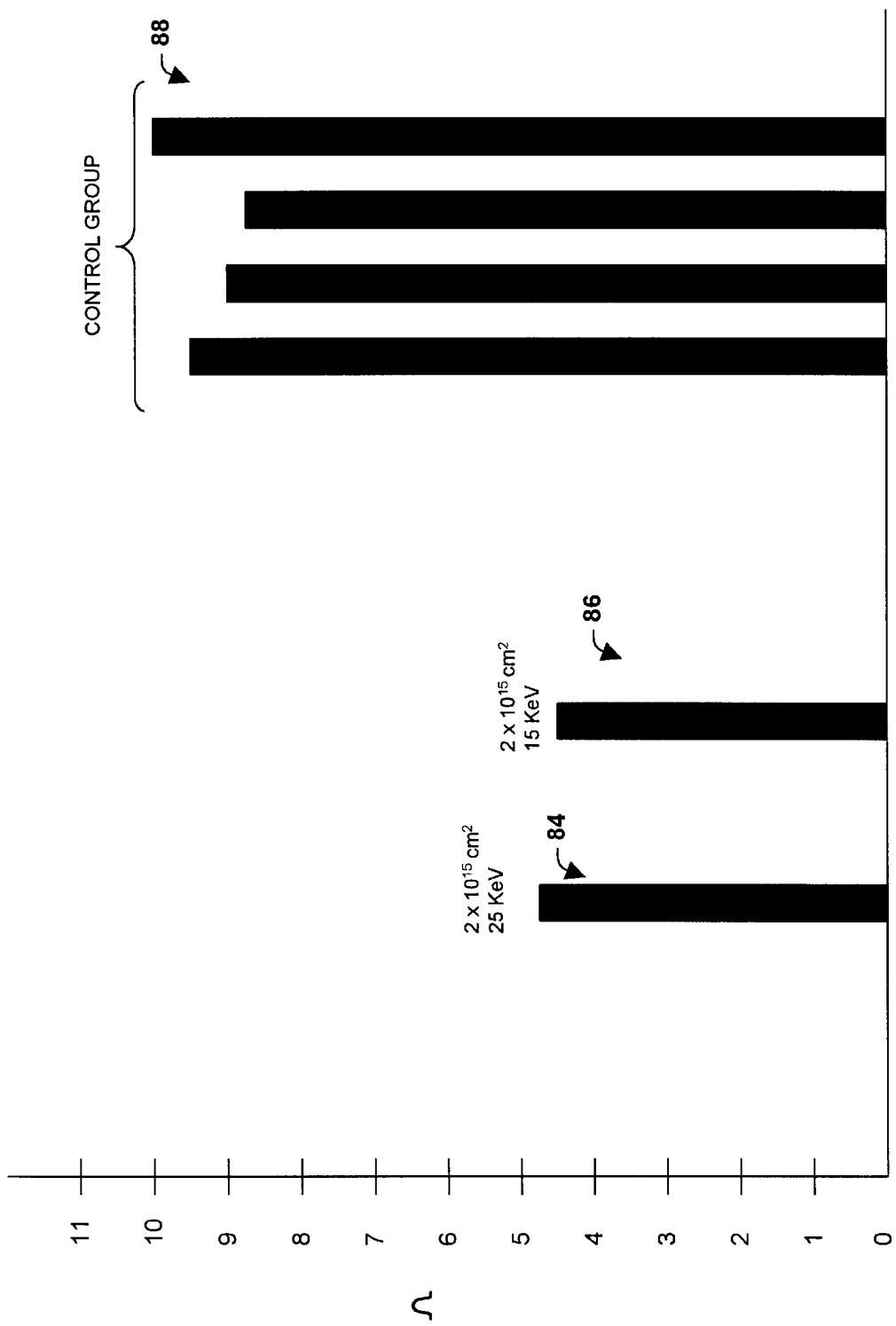
FIG. 2b is a bar chart illustrating resistance of CMOS devices fabricated in accordance with the present invention and CMOS control devices.
Figure 2C:
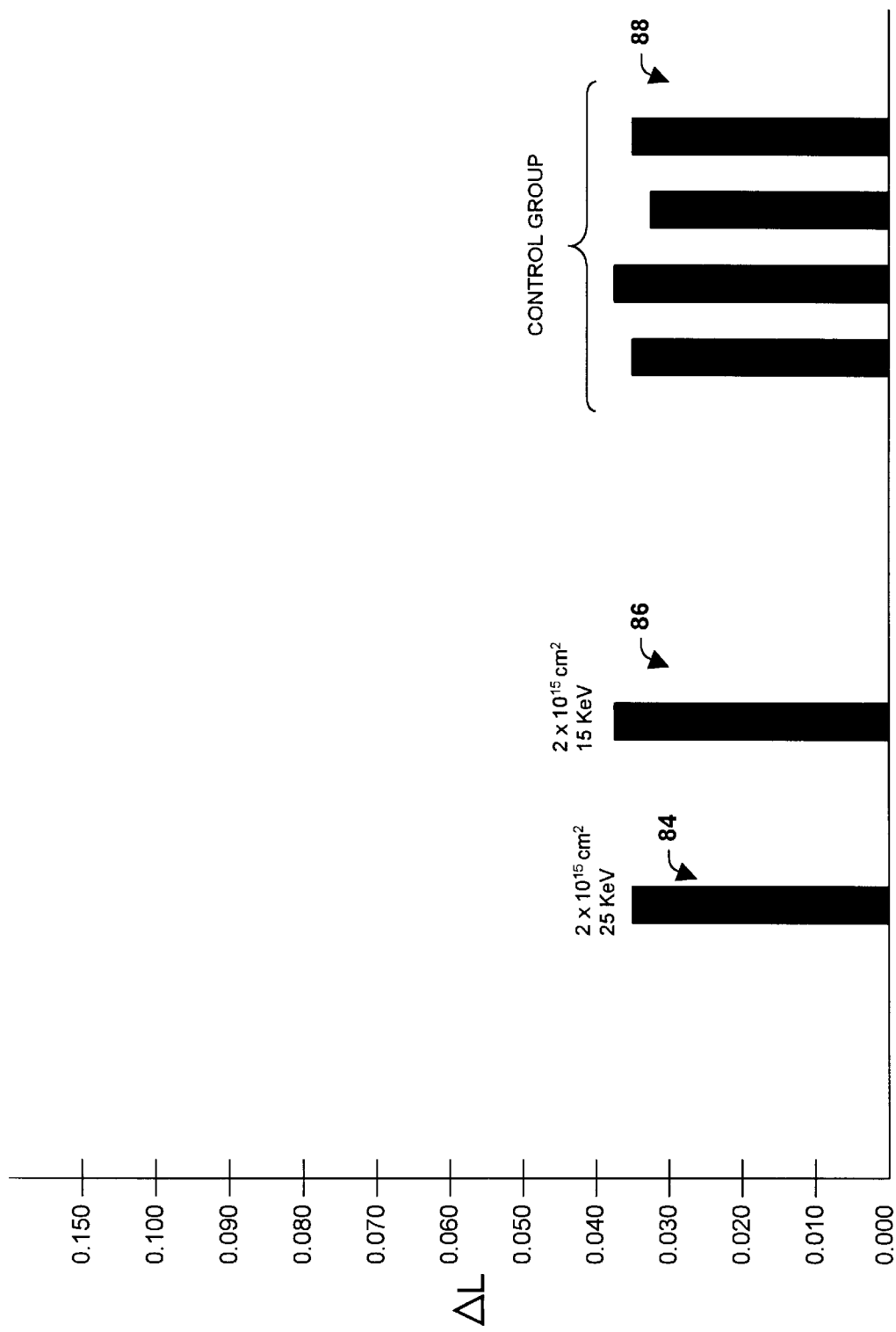
FIG. 2c is a bar chart illustrating the amount of source/drain extension overlap of CMOS devices fabricated in accordance with the present invention and CMOS control devices.

Referring briefly to FIGS. 2a–2c, experimental data bar charts are shown which illustrate the advantages provided by the present invention. FIG. 2a is a bar chart showing the sheet resistance of various source/drain extensions with and without the nitrogen implantation step of the present invention. Reference numeral 84 represents a CMOS device fabricated in accordance with the present invention wherein the nitrogen was implanted in the manner shown in FIG. 1f at $2 \times 10^{15}$ atoms/cm$^2$ with an energy level of 25 KeV. This CMOS device 84 has a sheet resistance of approximately 370 $\Omega/\square$ (ohms per square). Reference numeral 86 represents a CMOS device fabricated in accordance with the present invention wherein the nitrogen was implanted in the manner shown in FIG. 1f at $2 \times 10^{15}$ atoms/cm$^2$ with an energy level of 15 KeV. This CMOS device 84 has a sheet resistance of approximately 350 $\Omega/\square$.

Reference numeral 88 represents four CMOS devices which serve as control devices to be compared against CMOS devices 84 and 86. The control CMOS devices 88 were fabricated employing conventional techniques and thus do not include the nitrogen implantation 82 shown in FIG. 1f. The sheet resistances of the control devices 88 are substantially higher than the CMOS devices 84 and 86 fabricated in accordance with the present invention. The sheet resistances of the control CMOS devices 88 fall within the range of about 420 to 440 $\Omega/\square$.

Thus, it is readily apparent from FIG. 2a that the present invention provides for CMOS devices having lower sheet resistance than that of CMOS devices fabricated under conventional techniques.

FIG. 2b is an experimental data bar chart illustrating measurements of resistance of the CMOS transistor devices of FIG. 2a—the sheet resistance measurements of FIG. 2a were taken only from the source/drain extension of the device. In FIG. 2a only the resistance of the S/D extension regions are shown, however, in FIG. 2b the overall resistances of the CMOS devices are shown. As can be seen the CMOS devices 84 and 86 have an overall resistance that is lower than the overall resistance of the control CMOS devices 88. The resistances of the CMOS devices are shown in ohms only. The resistance for device 84 is about 4.75$\Omega$, the resistance for device 86 is about 4.6$\Omega$ and the resistances of the control devices 88 falls within the range of about 9.5$\Omega$ to 10.5$\Omega$. Thus, the present invention provides for CMOS devices having lower resistance than conventionally fabricated CMOS devices.

FIG. 2c is a bar chart illustrating the amount of diffusion of the S/D extension into the gate. In a CMOS device there is a polysilicon gate (e.g., 50 and 52) where when an implant is provided in the S/D extension region the implant not only goes in vertically but there is also horizontal (or lateral) spreading of the implant. That is the implant also spreads horizontally below the polysilicon gate—this is known as S/D extension overlap into the gate. The combined magnitude of S/D extension overlap in the horizontal directions is known as Delta L ($\Delta$L). This graph shows that the nitrogen implant 82 does not significantly increase the S/D extension overlap as compared to the CMOS control devices 88 where no nitrogen is implanted. As can be seen, $\Delta$L for CMOS devices 84, 86 and control devices 88 is about the same. Thus, the nitrogen implant 82 of the present invention does not increase lateral diffusion of the dopant in any significant manner.

After the nitrogen implantation 82 (FIG. 1f), CMOS fabrication steps are continued as is shown in FIGS. 1 g–1k. In FIG. 1g, a p-channel masking step is performed. A layer of photoresist material 90 is selectively formed over the substrate 10 which effectively masks off gate structure 50, and n-channel lightly doped drain regions 78 and 80. Then an p⁻ implant 96 is used to form p-channel transistor lightly doped regions 100 and 102 which are self-aligned with the gate 52. Portions of the lightly doped regions 78, 80, 100 and 102 will become the S/D extension regions of a CMOS transistor formed on p-substrate 10. A spacer material layer 120 is then formed over the p-substrate 10. The spacer material layer 120 may be formed of silicon dioxide ($SiO_2$), for example. Spacer material layer 120 may be formed of other materials provided that the selected materials may be suitably etched.

Figure 1I:
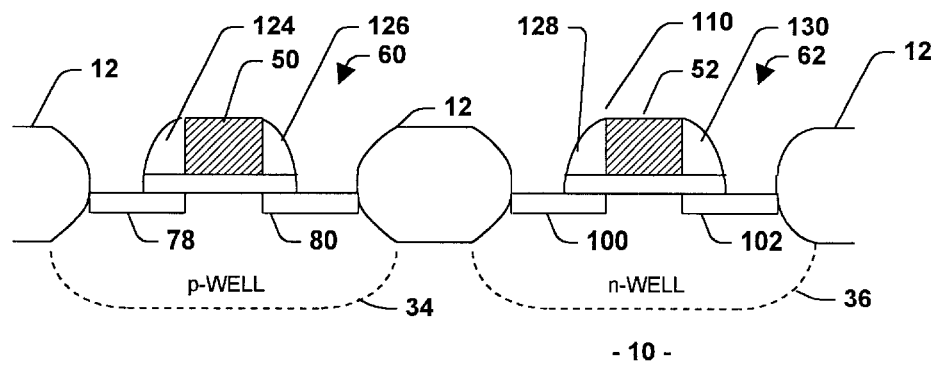
FIG. 1i is a schematic cross-sectional illustration of spacer formation in accordance with the present invention.

An etchant which selectively etches the spacer material layer 120 (i.e., etches the spacer material layer 120 at a faster rate than the silicon substrate), may be used to etch spacer material layer 120 until only spacers 124 and 126, and 128 and 130 respectively remain at the ends of gates 50 and 52 as shown in FIG. 1*i*.

Figure 1J:
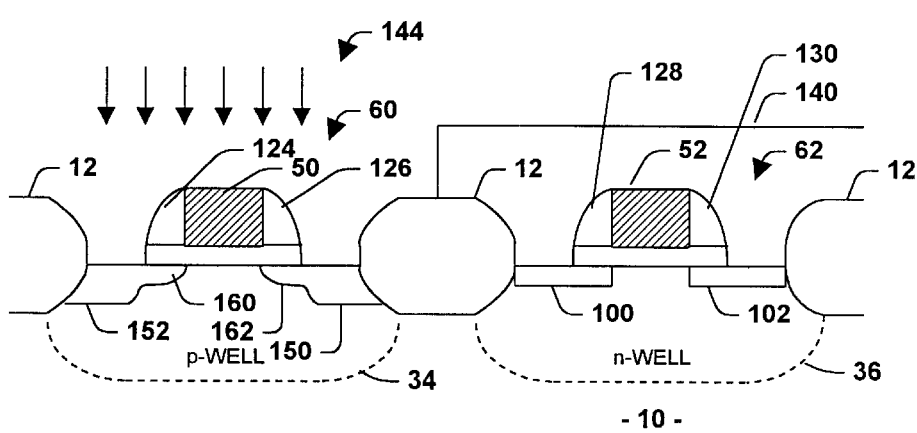
FIG. 1j is a schematic cross-sectional illustration of an $n^+$ implant step in accordance with the present invention.

After the formation of spacers 124, 126, 128 and 130 another mask and ion implant step is performed as shown in FIG. 1*j*. A layer of photoresist material 140 is selectively formed over the substrate which effectively masks off gate structure 52, and the p-channel lightly doped regions 100 and 102. Then, an n⁺ implant 144 is performed to form n⁺ source region 150 and n⁺ drain region 152 in portions of the lightly doped regions 80 and 78, respectively. Spacers 124 and 126 serve as masks to prevent ion implantation in the portions of lightly doped regions 78 and 80 underlying spacers 124 and 126. These protected portions of the lightly doped regions 78 and 80 are the respective LDD region 160 and lightly doped source ("LDS") region 162 of the n-channel transistor 60.

Figure 1K:
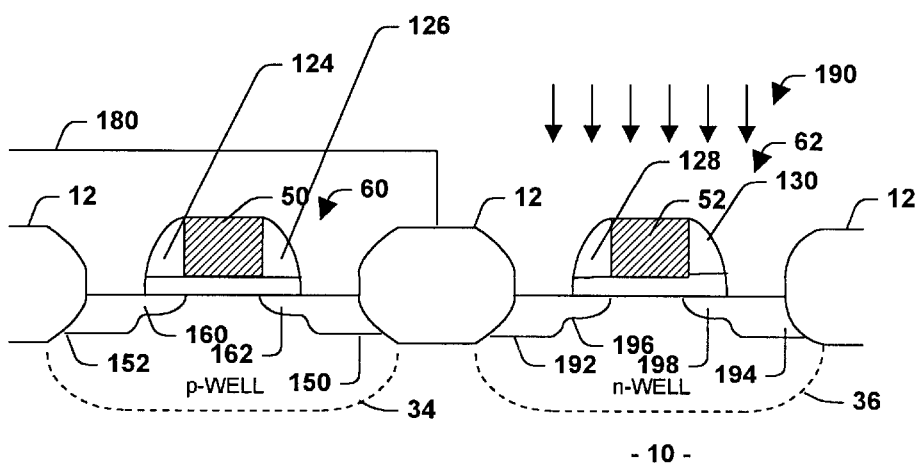
FIG. 1k is a schematic cross-sectional illustration of an $p^+$ implant in accordance with the present invention.

Similarly, in another masking step and ion implant step shown in FIG. 1*k*, a layer of photoresist material 180 is selectively formed over the substrate 10 which effectively masks off gate structure 50 and the n-channel n⁺ source region 150 and n⁺ drain region 152. Then, a p⁺ implant 190 is performed to form p⁺ source region 192 and p⁺ drain region 194 in portions of the lightly doped regions 100 and 102 underlying spacers 128 and 130. These protected portions of the lightly doped regions 100 and 102 are the respective LDS region 196 and LDD region 198 of the p-channel transistor 62.

The photoresist layer 180 may then be stripped leaving the spacers 124, 126, 128 and 130. Standard silicide is formed on the drain, source and polygate. The process is thus complete in relevant part.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of fabricating in a bulk material substrate a complimentary MOS transistor having a source/drain extension, comprising the step of:

implanting nitrogen into the source/drain extension at a dose within about a range of $1 \times 10^{14}$ atoms/cm² to $5 \times 10^{15}$ atoms/cm².

2. The method of claim 1, wherein the nitrogen implantation is applied at an energy within about a range 1 KeV to 100 KeV.

3. The method of claim 1, further including the step of implanting arsenic.

4. The method of claim 3, wherein the arsenic is implanted before the nitrogen is implanted.

5. The method of claim 3, wherein the nitrogen is implanted before the arsenic is implanted.

6. The method of claim 3, wherein the arsenic is applied at a dose within about the range of $1 \times 10^{14}$ atoms/cm² to $1 \times 10^{16}$ atoms/cm².

7. The method of claim 3, wherein the arsenic is applied at an energy within about a range of 1 KeV to 100 KeV.

8. The method of claim 1, wherein the transistor includes an NMOS device and PMOS device.

9. The method of claim 8, wherein the PMOS device is masked and the nitrogen is implanted into the NMOS device.

10. A method of fabricating a complimentary MOS transistor comprising the steps of:

providing a substrate having field oxide regions thereon;

providing an p-well region by masking a portion of the substrate with a first photoresist layer and implanting p-well dopants;

providing an n-well region by masking the portion of the substrate designated for the p-well region with a second photoresist layer and implanting n-well dopants;

forming a polygate structure on the n-well and p-well regions;

masking the n-well region with an n-channel LDD mask;

implanting n-type impurities into the p-well region; and implanting nitrogen into the p-well region, at a dose within about the range of $1 \times 10^{14}$ atoms/cm² to $5 \times 10^{15}$ atoms/cm² and at an energy within about a range of 1 KeV to 100 KeV.

11. The method of claim 10, wherein the nitrogen is implanted into a source/drain extension region of the transistor.

12. The method of claim 10, wherein the n-type impurities include arsenic.

13. The method of claim 10, wherein the n-type impurities include phosphorus.

14. The method of claim 12, wherein the arsenic is applied at a dose within about the range of $1 \times 10^{14}$ atoms/cm² to $1 \times 10^{16}$ atoms/cm².

15. The method of claim 12, wherein the arsenic is applied with an energy within about a range of 1 KeV to 100 KeV.

16. The method of claim 10, wherein the transistor includes an NMOS device and PMOS device.

17. The method of claim 10, wherein the PMOS device is masked and the nitrogen is implanted into the NMOS device.

18. A method of fabricating in a bulk material substrate a field effect transistor having a source/drain extension region, comprising the step of:

implanting nitrogen into the source/drain extension region at a dose within about a range of $1 \times 10^{14}$ atoms/cm² to $5 \times 10^{15}$ atoms/cm².

19. The method of claim 18, wherein the nitrogen implantation is applied at an energy within about a range 1 KeV to 100 KeV.

* * * * *